(12) United States Patent
Barker et al.

(10) Patent No.: US 7,976,263 B2
(45) Date of Patent: Jul. 12, 2011

(54) INTEGRATED WAFER TRANSFER MECHANISM

(76) Inventors: David Barker, Walnut Creek, CA (US); Robert T. LoBianco, Sunnyvale, CA (US); Sai Mantripragada, Fremont, CA (US); Farzad Tabrizi, Reno, NV (US)

( * ) Notice: Subject to any disclaimer, the term of this patent is extended or adjusted under 35 U.S.C. 154(b) by 941 days.

(21) Appl. No.: 11/859,752

(22) Filed: Sep. 22, 2007

(65) Prior Publication Data

US 2009/0082895 A1    Mar. 26, 2009

(51) Int. Cl.
 *B25J 15/10* (2006.01)
 *F26B 3/08* (2006.01)
(52) U.S. Cl. .............. 414/416.11; 414/431; 414/422
(58) Field of Classification Search ............ 414/411, 414/217, 935, 416.03, 416.11, 431, 422; 422/99, 63, 65
See application file for complete search history.

(56) References Cited

U.S. PATENT DOCUMENTS

| | | | |
|---|---|---|---|
| 6,126,381 A | 10/2000 | Bacchi et al. | |
| 6,253,118 B1 * | 6/2001 | Koyama | 700/218 |
| 7,066,707 B1 | 6/2006 | Bonora et al. | |
| 7,361,309 B2 * | 4/2008 | Vann et al. | 422/99 |
| 7,578,650 B2 * | 8/2009 | Aalund et al. | 414/806 |
| 7,607,879 B2 * | 10/2009 | Hall et al. | 414/217 |
| 7,648,327 B2 * | 1/2010 | Bonora et al. | 414/744.3 |
| 7,771,151 B2 * | 8/2010 | Bonora et al. | 414/217.1 |

FOREIGN PATENT DOCUMENTS

| | | |
|---|---|---|
| JP | 06 124995 | 5/1994 |
| WO | WO 99/17244 | 4/1999 |
| WO | WO 99/52142 | 10/1999 |
| WO | WO 01/40086 | 6/2001 |
| WO | WO 03/021645 | 3/2003 |
| WO | WO 2004/077531 | 9/2004 |

OTHER PUBLICATIONS

PCT Search report and written opinion—PCT/IB2008/053825—dated Jul. 22, 2009.

* cited by examiner

*Primary Examiner* — Ronnie Mancho
(74) *Attorney, Agent, or Firm* — Tue Nguyen

(57) ABSTRACT

An integrated high speed robotic mechanism is disclosed for improving transport equipment, integrating an object movement with other functionalities such as alignment or identification. The disclosed integrated robot assembly typically comprises an end effector for moving the object in and out of a chamber, a rotation chuck incorporated on the robot body to provide centering and theta alignment capability, and an optional identification subsystem for identifying the object during transport. The present invention also discloses a transfer robot system, employing a plurality of integrated robot assemblies; a transfer system where a transfer robot system can service a plurality of connected chambers such as FOUP or FOSB; a front end module (FEM); or a sorter system. Through the use of these incorporated capabilities into the moving robot, single object transfer operations can exceed 500 parts per hour.

25 Claims, 10 Drawing Sheets

- Robots A and B change sides
- Wafer on Robot A is being scanned for OCR and notch alignment in transit

INTEGRATED WAFER TRANSFER MECHANISM

FIELD OF THE INVENTION

The present invention relates to apparatuses and methods to transfer objects, and more particularly to multiple integrated robot assembly, integrating object transfer with other functionality, such as ID reading or object aligning.

BACKGROUND OF THE INVENTION

Robot assemblies are an important component in automation, especially in manufacturing facilities and manufacturing equipments. For example, in the semiconductor industry, robot arms are used to handle semiconductor wafers, flat panel display, LCD, reticles, masks, or carrier boxes.

In the semiconductor fabrication facility, robot can be used to transport work pieces, typically stored in carrier boxes, from one location to another location, from one equipment type to another piece of equipment. In a process system, a robot is typically used to remove the work pieces from the carrier boxes, and then load them into a load lock. Another robot can be used to move the work piece from the load lock into a processing chamber and from one processing chamber to another processing chamber. Thus within a processing system, there might be a plurality of robots, each one is designed for a particular task. The processing system could be a deposition system, an etch system, a lithography system, a metrology system, an inspection system, an implantation system, a treatment system, or any work piece processing system.

Another type of equipment is supplemental equipment such as a stocker, designed for storing the work pieces until needed, or a sorter, designed for sorting the work pieces into certain desirable order. In a typical bare stocker system, a robot is typically used to remove the work pieces from the carrier boxes, and then load these pieces into a load lock. Another robot can be used to move the work piece from the load lock into a storage chamber, where the work pieces are stored without the original carrier boxes. For a box stocker system, the work pieces are stored together with the carrier boxes, without the need for removing them out of the carrier boxes.

Robot handling can be considered overhead operation, since the purpose of robot handling is to transport the work pieces between locations. Thus to improve the efficiency of the fabrication facility and to improve the throughput of the equipment, faster movement of robots, and multiple robot assemblies can be used. Thus some equipment provides a robot assembly with multiple carrier arms, to allow the transfer of multiple work pieces. The multiple carrier arms are typically not independent, and thus maximum efficiency cannot be realized. Another robot configuration includes multiple independent robot arms which can move independently, and thus can essentially double the throughput with one robot. Still another robot configuration includes two separate robots to transport the wafers for processing.

With advancements in fabrication processes comes the demand for higher throughput, smaller footprint and better functionality. Integrated robot assembly, combining the transfer mechanism with other functions such as object identification and object alignment, can better address this need.

SUMMARY

The present invention discloses apparatuses and methods for improving transport equipment of semiconductor fabrication objects, such as semiconductor wafers, reticles, flat panel displays. In one embodiment, the present invention discloses an integrated transfer mechanism, combining the object transfer with other functionalities such as object identification, object alignment or object centering. The object identification subsystem can comprise an Optical Character Reader (OCR) component for reading the object inscribed marks. This functionality provides the identification and confirmation of object to be processed, without or with minimum throughput reduction. The object alignment subsystem can comprise a rotation chuck for rotating the object to an orientation mark. This functionality provides the in-situ alignment of object to be processed.

In an embodiment, the present invention includes a method for simultaneous movements. The disclosed method can be applied to object transfer, such as a front end module to transfer wafers, or to object sorter, such as wafer sorter or stocker. A motion command comprised of simultaneous actions includes the movement of a robot system from one wafer position to another wafer position. The other movement of the simultaneous movements includes a wafer identification operation, a wafer ID searching operation, a wafer alignment operation, or a wafer centering operation. In a preferred embodiment, the simultaneous movements exclude the movement of the end effector of the same wafer. Thus the simultaneous movements start only after the wafer has been received from the source FOUP, and comes to rest at the resting position on the robot assembly. The simultaneous movements also stop before the wafer can be placed in a destination FOUP. Thus the simultaneous movements occur only during the movement of the robot body, and do not occur during the movement of the end effector.

This limitation of the simultaneous movements serves to decouple the end effector movements with the robot body movements. The robot body movements occur within the transfer environment, and thus there is typically no space constraint. In contrast, the end effector movements occur within the cassette, or FOUP, thus the pitch between these wafers can become a vertical space constraint. The thickness of the end effector assembly can be limited by the pitch between two adjacent wafers, which can be only a few millimeters. Additionally, the end effector's position within the cassette or FOUP precludes lateral motion which would cause the end effector to collide with the inside surfaces of the cassette or FOUP causing damage to the cassette or FOUP.

In an embodiment, the present invention discloses a robot assembly which can provide simultaneous movements. The robot assembly comprises a robot body, an end effector coupled to the robot body, a rotation chuck coupled to the robot body and/or a reader coupled either to the robot body or to the end effector. The robot assembly is preferably disposed in a transfer environment, such as a transfer chamber, a front end module, or a front interface mechanism. In an aspect, the present invention integrates dual spindle alignment and identification into a robotic system thereby providing a capability to simultaneously align and identify 2 objects independently and in parallel operation to theta, z and translation motion.

In an embodiment, the integrated transfer system can comprise at least two independent robot assemblies, together with a controller for coordinating the robot assemblies. The two robot assemblies each can comprise a support body having an x-movement mechanism for moving an end effector to handle an object in a station. A rotating mechanism is further disposed on the support body for rotating an object when the end effector retracts. Each robot assembly can also comprise an additional movement mechanism, such as y-, z, or theta movement mechanism for moving the robot body or the robot assembly. Thus the two robot assemblies can operate independently, controlled by the controller for coordinating and synchronizing the movements for best efficiency.

In another embodiment, the integrated transfer system can comprise a support body having at least two dependent robot assemblies, an additional movement to move the support body, together with a controller for coordinating the robot assemblies. The two robot assemblies each can comprise an x-movement mechanism coupled to the support body for moving an end effector to handle an object in a station. A rotating mechanism corresponding to each end effector is further disposed on the support body for rotating an object when the end effector is at rest position. The additional movement mechanism, such as y-, z, or theta movement mechanism is designed for moving the support body or the two robot assemblies. Thus the two robot assemblies can move together as a unit with the additional movement mechanism, controlled by the controller for coordinating and synchronizing the movements for best efficiency.

The present invention integrated transfer mechanism can be used in a sorter or stocker equipment, such as a wafer sorter or stocker, a LCD sorter or stocker, or a reticle sorter or stocker. It can also be used in processing equipment such as deposition, etching, track, lithography exposure, developer, and bake. It can also be used in transport work pieces from a load lock to a buffer, or to a process chamber, to a storage chamber, or to a sorter chamber. It can also be used in Front End loader, to transfer work pieces from FOUPs to load locks.

DETAILED DESCRIPTION OF THE PREFERRED EMBODIMENTS

Figure 1:
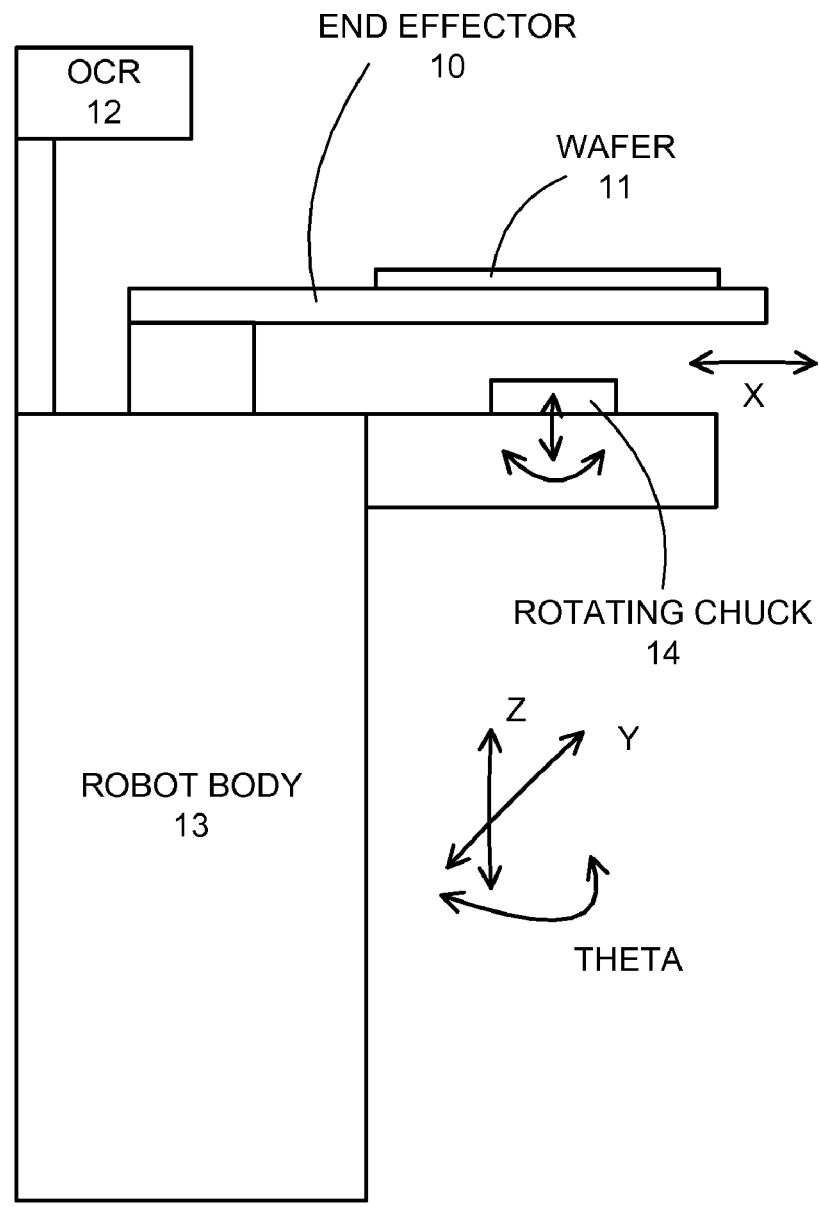
FIG. 1 shows an exemplary robot assembly according to the present invention.

The invention will now be described with reference to the drawings, in which like reference numerals refer to like parts throughout.

In an embodiment, the present invention discloses apparatuses and methods for improving transport equipment of semiconductor fabrication objects, such as semiconductor wafers, reticles, flat panel displays. The improvements can comprise an integration of other functionalities into the object transport movement, thus adding functionalities and potentially improving throughput and reducing footprint.

An exemplary improvement is the integration of an object alignment subsystem to the object transfer robotic system, which can perform object alignment during the object transfer. Another exemplary improvement is the integration of an object identification subsystem to the object transfer robotic system, which can perform object identification during the object transfer, thus potentially identifying, sorting, or confirming the objection identity before processing. Another exemplary improvement is the integration of both object alignment and object identification subsystems to the object transfer robotic system. The incorporated improvements can bring new capabilities in simultaneous movements of the object transfer mechanisms.

In an embodiment, the present invention includes methods for simultaneous movements of transferring object, performing multiple parallel movements of the object, except when the object being handled by the end effector. Thus the simultaneous movements start only after the object has been received from the source FOUP, and after the object has come to the resting position on the robot assembly. The simultaneous movements also stop before the object can be placed in a destination FOUP. Thus the simultaneous movements occur during the movement of the robot body, and do not occur during the movement of the end effector for the same object.

In an exemplary embodiment, the combined actions of object transfer and alignment and/or identification occur during the moving of the robot body, and not during the movement of the end effector. In this aspect, the design of the end effector can focus on the movement of the object in and out of the chamber, accommodating the small pitch of multiple objects, and the possible small opening of the chamber. Thus the design of the end effector can be free from the constraints of other movement mechanisms. For example, for picking a wafer from a cassette, the end effector starts from a resting position, extends outward toward the cassette between two adjacent wafers, then lifts up to pick up a wafer, and then retracts to the resting position.

In an embodiment, the limitation of the simultaneous movements is independent of the other robot assembly, meaning the limitation of the simultaneous movements applies only to the movements of the same end effector for the same wafer. For example, there are no simultaneous movements of wafer rotation or wafer lateral movement for wafer A when wafer A is being placed or retrieved from a FOUP. However, simultaneous movements of wafer rotation or wafer lateral movement for wafer A can occur when wafer B is being placed or retrieved from a FOUP by the end effector.

In an aspect, the simultaneous movements, occurring in parallel with the movement of the robot body, comprise object centering, object rotating, object aligning, object ID locating, object reading and/or object identifying. Object centering can be accomplished by a centering mechanism. Object rotating and object aligning can be performed by rotating the object through the rotation of a rotatable chuck. Object reading can be accomplished with an OCR reader. Object ID locating can be performed with a stationary reader and a rotating object, or with a rotating reader around the object.

For example, simultaneous wafer centering can be performed. A centering mechanism with respect to the rotation chuck can be applied, such as a 3-pin movement or a 2-bar movement to push the wafer to the centering position. Centering can also be accomplished by lifting the substrate off the constraint of the wafer paddle and rotating it above a linear sensor thereby measuring its eccentricity. Once calculated, the alignment axis can be aligned with the axis of the wafer paddle; the substrate lowered onto the wafer paddle, moved a prescribed distance, lifted by the rotational chuck and remeasured for eccentricity by the linear sensor. This can be accomplished parallel to other robotic operations.

Simultaneous wafer alignment can also be performed. At the end effector resting position, the rotation chuck is raised to free the wafer from the constraint of the end effector. Then the rotation chuck can rotate to align the wafer, to a notch, a flat or a wafer ID location, according to a notch, flat or ID finder mechanism. After the completion of the alignment, the rotation chuck is lowered, and the wafer resting on the end effector again. The wafer centering is typically performed before the wafer alignment for provide the centricity needed for stable rotation.

Simultaneous wafer identification can also be performed. A wafer identification assembly such as an OCR subsystem can read the wafer ID. The wafer identification subsystem can be positioned at a location where the wafer ID is known. The wafer identification subsystem can be dependent of the wafer alignment subsystem where the wafer is rotated to position the wafer under the wafer identification subsystem. The wafer identification subsystem can be independent of the wafer alignment subsystem where the wafer identification subsystem rotate to search for the wafer ID.

The disclosed methods can be applied to object transfer, such as a front end module to transfer wafers, or to object sorter, such as wafer sorter or stocker. A motion command comprised of simultaneous actions includes the movement of a robot system from one wafer position to another wafer position. The other movement of the simultaneous movements includes a wafer identification operation, a wafer ID searching operation, a wafer alignment operation, or a wafer centering operation.

In an embodiment, the method comprises rotating an object, aligning an object to an alignment mark, identifying an object by reading an ID mark, or any combination thereof, during an object movement between locations. The different locations can be different slots in the same station, or slots in different stations. Thus movements between object locations can be movements between same or different object locations of different stations, or movements between different object locations within a station. The object movement during the simultaneous movements includes the movements of all objects between stations, but excludes the movement of the same object to and from an object location. The object movements to and from an object location include extending or retracting an object from an object location such as a storage area. Extending an object further includes placing an object to a storage position, such as extending the end effector carrying the object, lowering the object to the location support, and retracting the end effector. Retracting an object further includes retrieving an object from a storage position, such as extending the end effector, raising the end effector to extract the object from the location support, and retracting the end effector with the object.

For example, during the movements of object A from FOUP A to FOUP B, or from a position of FOUP A to another position of FOUP A, object A can perform other movements such as rotating. However, during the retrieval or placing of object A from or to a FOUP, object A is precluded from being rotated, aligned or ID read. However, object B is not so restricted, and can perform these operations during the movements of object A.

In an embodiment, the present method can be applied to an integrated transfer mechanism comprising at least two x-movement mechanisms, at least two rotating mechanisms, and at least a y-movement mechanism. The x-movement mechanisms are designed for handling an object in an object location, such as placing or retrieving. The y-movement mechanism is designed to move the object or the object support assembly between different object locations. The rotating mechanisms provide the simultaneous movements during the x- and y-movements.

In an embodiment, the present method comprises rotate the object during the y-movements of all objects, during the x-movements of other object assembly and not during the x-movements of the same object assembly. For example, during the y-movement of the assembly to a new location or during the x-movement of the end effector handling an object, the rotating mechanism can extend a rotating chuck to support the other object, rotating the other object, and then retracting the rotating chuck after completing the rotation.

In an embodiment, the present invention discloses an integrated robot assembly, which can provide simultaneous movements. In an aspect, the integrated robot assembly comprises a robot body, a movement mechanism to move the robot body, an end effector coupled to the robot body, a rotation chuck coupled to the robot body and/or a reader coupled either to the robot body or to the end effector. The robot assembly is preferably disposed in a transfer environment, such as a transfer chamber, a front end module, or a front interface mechanism.

The robot body movement mechanism provides the movements needed for stationing the end effector in the right position for receiving or for placing an object. The robot body can comprise a z-direction motion to address all objects or chambers in a stacked configuration, and a y-direction motion to address object stations disposed linearly in a y direction. For object stations disposed in a circular or a surrounding configuration, the robot body mechanism can comprise a theta motion. For object stations disposed in a linear configuration, the robot body can comprise a linear motion such as a traverse track or a linear guide.

In an aspect, the robotic system comprises a robot body to support an end effector for moving an object in and out from the transfer environment, and from/to a plurality of process or storage chambers coupled to the transfer environment, such as a process chamber, a load lock chamber, a FOUP (front end unified pod), or a FOSB (front opening shipping box). In a load lock, pod or box, the objects are typically stacked with a small pitch, order of a few millimeters. In a process chamber, the object is typically separate from a support, also a small distance order of a few millimeters. Thus the end effector is preferably a thin blade, as thin as practical. The end effector can comprises support pads for supporting the object and for preventing slippage. The end effector can comprise vacuum ports for holding the object. The end effector can comprise edge grips for edge contact handling. Further, the end effector can comprise a plurality of gas ports to provide an air cushion, thus the object can float on an air gap without touching any part of the end effector. The end effector can comprise edge pins for prevent slippage of the object. The end effector extending and retracting motions preferably comprise articulate joint arms or linear motions through linear guides, but can be any mechanical motions. The end effector can also provide lifting motion (e.g. z-direction) for lifting objects. The end effector can comprise edge gripping, air cushion, or vacuum suction for holding the object.

In an aspect, the object alignment subsystem comprises a rotation chuck, disposed on the robot body, and thus moving with the robot movements. Thus the object can be aligned during the movement of the robot body. The alignment can be to a notch, a flat, or to the orientation of the wafer ID. The alignment subsystem can further comprise a centering mechanism, such as edge grip pads. The rotation chuck can be coupled to the robot body, thus decouples the end effector functionality with the rotation movement. The rotation chuck can provide object rotation, and preferably comprises vacuum suction, electrostatic, or edge grip for holding the object. An object centering mechanism might also be provided to center the object on the rotation chuck.

In an aspect, the object identification subsystem comprises an OCR assembly or a wafer ID reading assembly, disposed on the robot body, and thus moving with the robot movements. Thus the object can be identified during the movement of the robot body. The ID reading can be done from the top or the bottom of the object. The object identification subsystem can be disposed on the robot end of the end effector, if this position would not interfere with the functionality of the end effector. ID tracking mechanism can also be provided to allow the object identification subsystem to find the object ID.

The object reader, such as an OCR reader, can be coupled to either the robot body or the end effector body. The object reader can read the object ID to provide identification and confirmation that the receiving or placing object is indeed the right object. A stationary object reader can be mounted on the robot body or on the robot's end of the end effector without interference with the end effector's functionality. However, it could interfere with the opening to the receiving chamber. Thus a stationary object reader is preferably mounted on the robot body, though mounting on the end effector is possible. In an aspect, the object reader is rotating around the object for locating the object ID. The rotating object reader is preferably coupled to the robot body in order to decouple from the functionality of the end effector. The object reader and the object can both be rotated, though preferably in opposite direction to improve efficiency.

FIG. 1 shows an exemplary basic robot assembly 13, comprising an x-movement of an end effector 10 to transfer an object 11 and a rotation movement of a rotating chuck 14 to align the object. The robot assembly can comprise other movements, such as robot theta rotation, robot y- and z-movements. The rotating chuck can also include an up/down movement, for example, to lift the object away from the end effector. The exemplary robot assembly can also comprise an alignment or OCR subsystem 12 for object aligning or ID reading.

In another exemplary embodiment, the integrated transfer mechanism is employed in a transfer system, such as a FIM (front interface mechanism), or a FEM/EFEM (front end module or equipment front end module). The chambers can be arranged in a circular ring around the integrated transfer mechanism, arranged linearly at one side of the integrated transfer mechanism, or arranged linearly at both side of the integrated transfer mechanism. The present invention integrated transfer mechanism can also be used in a stocker or in the front end assembly to transfer work pieces between cassettes in a pod assembly. The front end assembly generally contains a horizontal motion robot assembly to move a work piece to the front end module or to the central module.

The robot assembly further can comprise a plurality of sensors, such as work piece positioning sensors, image sensing of position errors, RF electric field sensing, magnetic resonance sensing, laser scanning, sensing with photo detector arrays, motor operation sensing, arm position sensing, or any sensors related to the operation and service. Furthermore, the sensors provides the status and locations of the robot assembly, thus allowing the optimum utilization of the remaining operative part of the assembly, plus the alerting the operator for servicing the inoperative parts of the assembly.

The robot assembly can perform simultaneous movements for increasing throughput and reducing footprint. An exemplary transfer sequence could include the end effector extending to retrieve a wafer, and then retracting to a resting position. The rotating chuck lifts up to support the wafer, and then begins rotate for alignment and OCR process. During this process, the robot assembly can move to a new location, through the y-, z- or theta movement.

The movement mechanism can comprise a plurality of articulate joint arms, linear movement, or rotational theta movement. The movement mechanisms can include linear track, linear guide, lead screw, multi-segmented articulated arms, frog arms, swivel arms, scissors and telescopic mechanism, four-bar linkage mechanism. The robot assembly can be constructed with motors such as servo motors with a synchronous device.

In an exemplary embodiment, the present integrated transfer mechanism can comprise a plurality of robot assemblies, each with its own, or shared, end effector, wafer centering subsystem, wafer alignment subsystem such a rotation chuck and/or wafer identification subsystem such as an OCR.

The integrated transfer mechanism can comprise at least two robot assemblies, located next to each other, such as side by side, or one on top of the other. The operations of the integrated transfer mechanism are preferably controlled by a controller or a computer system to coordinate and synchronize the multiple robot assemblies.

The presence of more than one robot assemblies can provide benefits not realized with just one robot assembly or with one robot assembly having two end effectors. For example, for one robot assembly such as only robot A, the time for sorting wafer A (including rotating, centering, aligning or ID reading) happens during the time for traveling from FOUP A to FOUP B, thus a bottleneck would be either the sorting time or the traveling time. If the sorting time is longer than the traveling time, robot A would be arrive at the destination and still waiting for the wafer to complete sorting. If the traveling time is longer, then by the time robot A reaches the destination, the wafer already completes sorting, and thus ready to be placed.

For more than one robot assemblies, such as two robot assemblies, the limitation of sorting time can be significantly reduced. The sorting time can happen not only during the movement of robot A from FOUP A to FOUP B, but can also happen during the time that robot A has to wait for other robots to perform their tasks. For example, the sorting time can happen when robot A is waiting for robot B picking or placing a wafer. The dependency on sorting time can effectively be eliminated with additional robot assemblies. The number of additional robot assemblies can increase until there in no waiting time for the wafers to be sorted. Thus a plurality of robot assemblies can significantly reduce or eliminate the dependency on wafer sorting time. The throughput of a plurality of robot assemblies can be dependent only on the transfer time.

In an exemplary embodiment, the present integrated transfer mechanism comprises at least two robot assemblies linked together through the y-, z-, or theta movement together with a coordinating controller. This configuration provides complete independent of the robot assemblies, allowing the robot assemblies to handle wafers from two separate stations far apart. The movements of the robot assemblies are synchronized through the controller to ensure high throughput.

The integrated transfer system thus can comprise at least two robot assemblies, together with a controller for coordinating the robot assemblies. The two robot assemblies each can comprise a support body having an x-movement mechanism for moving an end effector to handle an object in a station. The end effector typically rests within the support body, and extends outward to reach the station. A rotating mechanism is further disposed on the support body for rotating an object when the end effector is at rest position. Each robot assembly can also comprise an additional movement mechanism, such as y-, z, or theta movement mechanism for moving the robot body or the robot assembly. Thus the two robot assemblies can operate independently, controlled by the controller for coordinating and synchronizing the movements for best efficiency.

Figure 2:
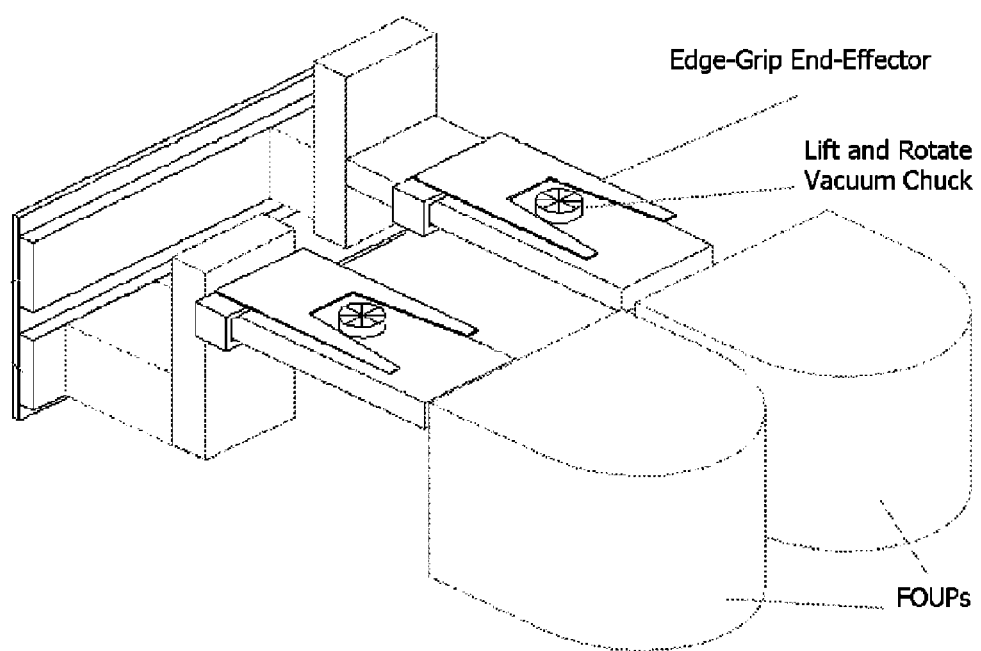
FIG. 2 shows an exemplary integrated transfer mechanism employing two independent robot assemblies.

FIG. 2 shows an exemplary configuration of two independent robot assemblies linked together through y-stage linear guides. Each robot assembly comprises a lift and rotating vacuum chuck, together with an end effector traveling in the x direction for handling wafer in a station such as a FOUP. An optional OCR camera can be disposed on the robot assembly for reading wafer ID. Each robot assembly further comprises its own linear z-stage, allowing the assembly to travel vertically to address all the wafers within the FOUPs. The z-stage travel for the two robot assemblies can overlap to ensure the reach of all possible wafer locations in the FOUPs. For cross movement, the vertical z-stage might need an extra movement to get out of the way. For example, one z-stage might have to move farther up while the other y-stage moves farther down during the exchanging positions of the robot assemblies.

The two robot assemblies are linked through two connected y linear guides, allowing the robot assemblies to travel between the FOUPs. The y-stage can comprise 2 positions, one in front of each FOUP. In this figure, the robot assemblies can travel between these two resting positions, from one FOUP to the other. The simultaneous movements of the two robot assemblies are coordinated and synchronized through a controller, not shown.

Other configurations linking the two independent robot assemblies are also possible. For example, the robot assemblies can be linked through two connecting z or theta movements.

This configuration sorter and transfer system employing two robot assemblies can effectively sort wafers in one FOUP and place them in the other FOUP. Since most of the movements are operated in parallel, the throughput of the sorter depends only on the longest operation, and throughput of more than 600 wafers per hour can be achieved. This integrated transfer mechanism can be employed in a transfer system, such as a FIM or FEM, and the arrangement can be employed in a sorter system for wafers or other objects. This figure shows two FOUPs located next to each other in a linear arrangement. The number of FOUPs can vary, but the arrangement is preferably still linear. The FOUPs can also be other wafer containers, such as FOBSs, load lock chambers, or wafer cassettes. In front the of FOUPs' opening is the transfer system, comprising two linear robot assemblies. There are two robot assemblies shown, but the number of robot assemblies can also vary.

Figure 3A:
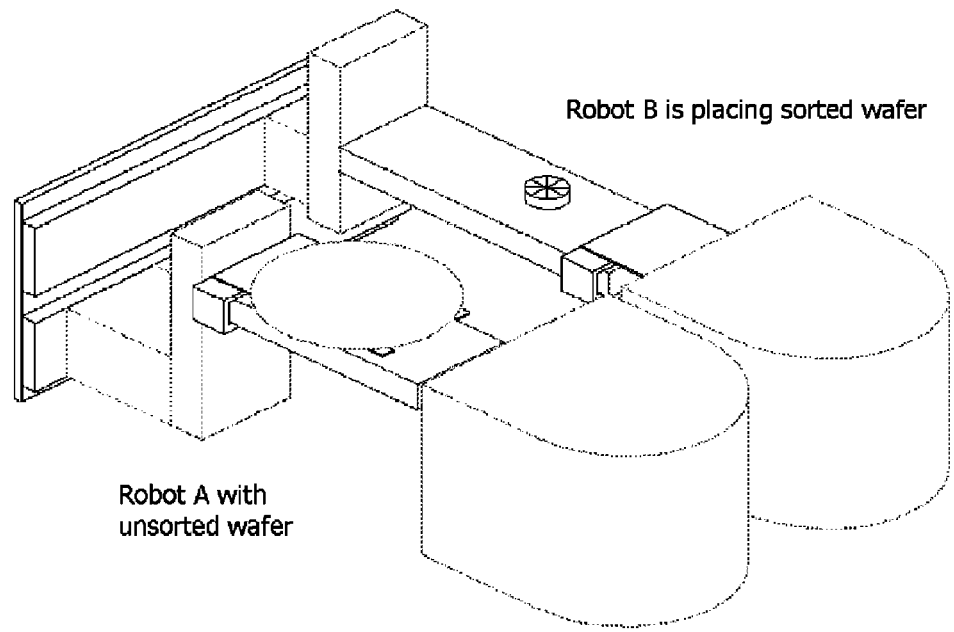
FIGS. 3A-3D show an exemplary process sequence for sorting wafers from a linear configuration of 2 FOUPs.
Figure 3B:
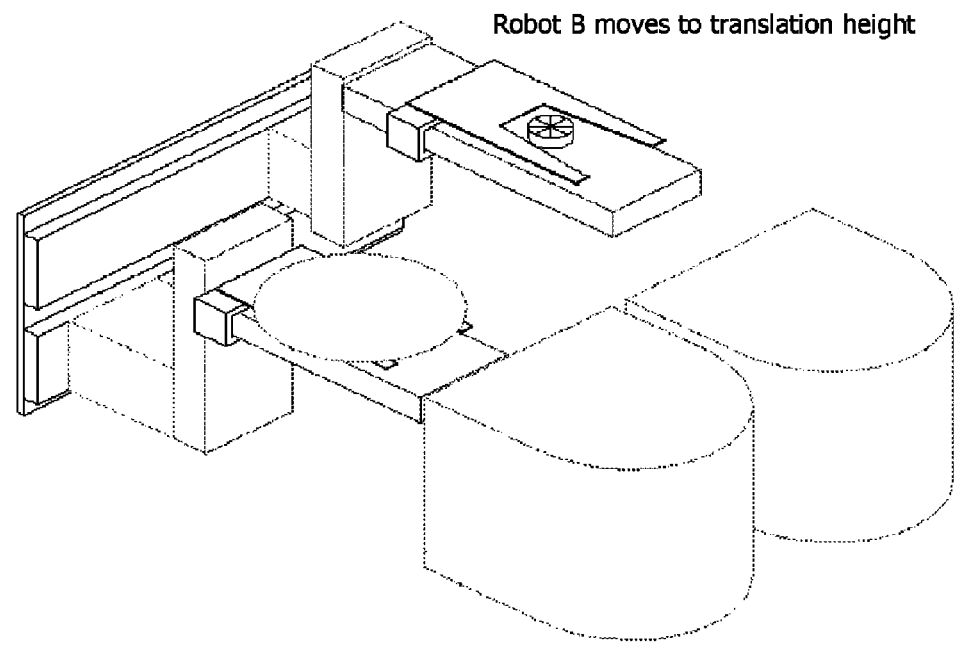
Figure 3C:
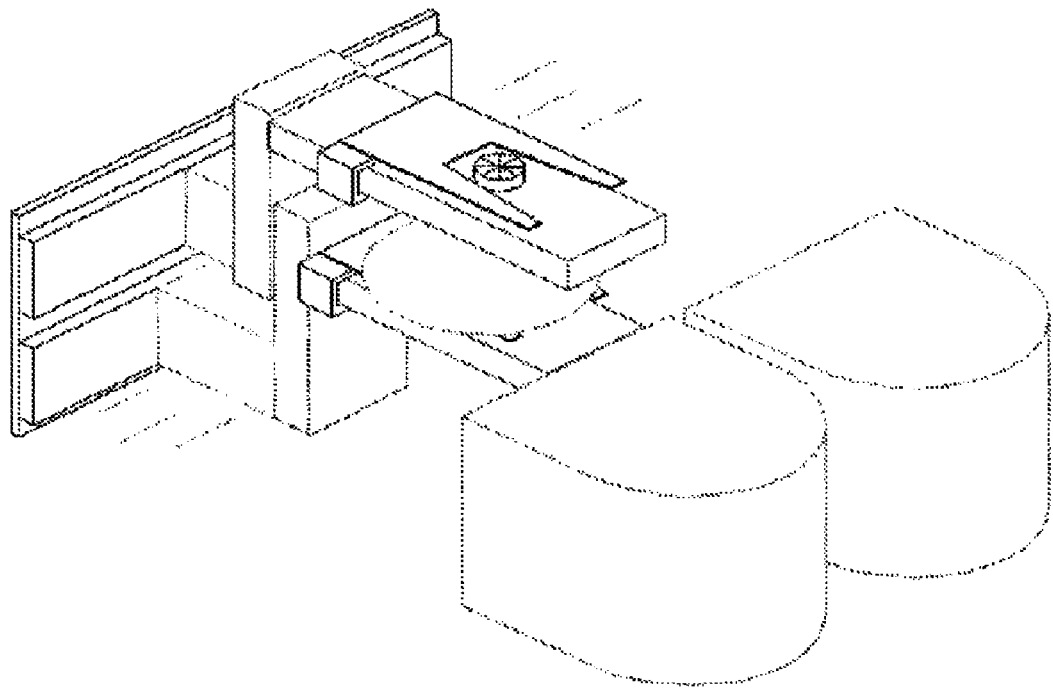
Figure 3D:
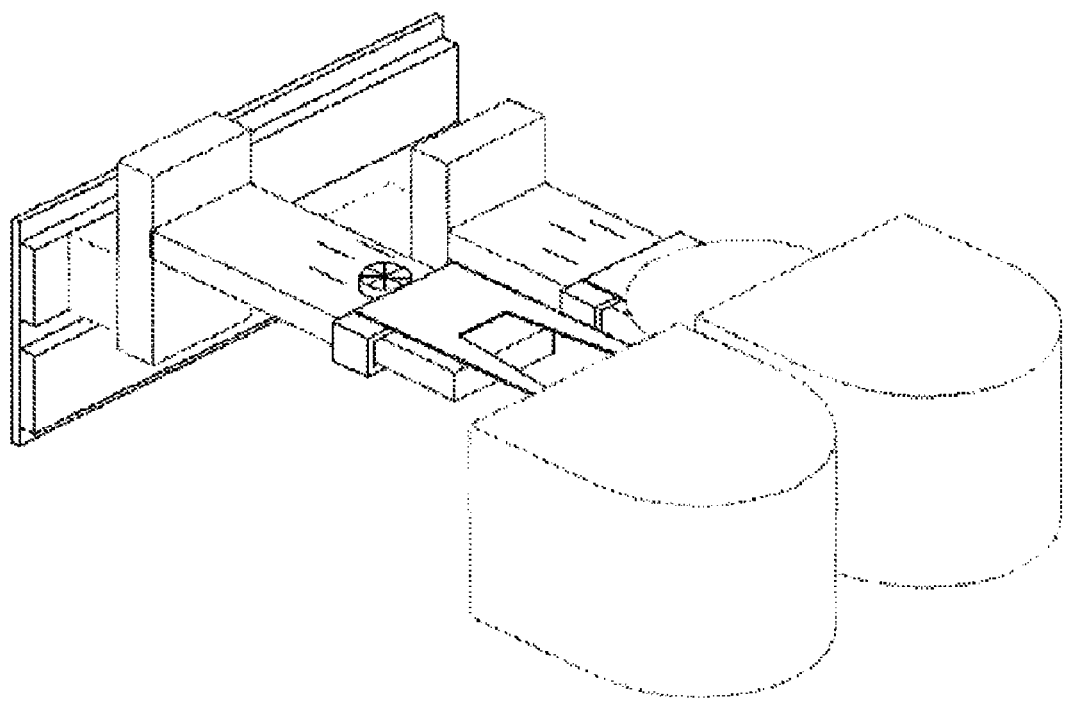

FIGS. 3A-3D show an exemplary moving sequence for this exemplary sorter, controlled by a controller. In FIG. 3A, robot A is with an unsorted wafer, received from FOUP A, and robot A is placing a sorted wafer into FOUP B. FIG. 3B-3C show the exchange of robots with robot A facing FOUP B and robot B facing FOUP B. First, the robot B moves to a translation height after placing the sorted wafer (FIG. 3B). Then the robots change side (FIG. 3C). During this exchange and/or during the movement of robot B, the wafer on robot A is being aligned (by the rotation chuck) and identified (by the OCR), thus the wafer on robot A is now sorted. Additional y movement might be needed to position the wafer to the correct slot. Since wafer sorting is performed during transit, the integrated robot assembly can combine robot movement (from FOUP A to FOUP B) and wafer sorting (center, alignment and identification) to improve throughput. Then FIG. 3D shows robot A putting sorted wafer into FOUP B, and robot A entering FOUP A to pick up the next unsorted wafer.

Additionally, since the two robot assemblies are independent, one wafer can be sorted at one robot assembly while the other robot assembly removes or places the other wafer. The simultaneously movements of one robot assembly can include the movement of the other robot assembly. In other words, the sorting of wafer on robot A can happen during the removing or picking wafer of robot B, as well as during the moving of the robot system.

For example, after robot A picks unsorted wafer A from FOUP A, robot A retracts to the resting position. Then the robot system moves to pick up wafer B. If wafer B is in FOUP A, the movement of robot B consists of a vertical movement to position the robot B end effector at the correct position. If wafer B is in FOUP B, the movement of robot B also includes a traverse action to position the robot system at the door of FOUP B, before the vertical movement. During this movement, including the movement of the robot system and the movement of the end effector of robot B, robot A can simultaneously perform other actions such as centering, aligning and/or identifying.

After robot B finishes picking wafer B, the robot system moves to the position for placing the now-sorted wafer A. Thus the time for sorting wafer A now includes the transit time from the source of wafer A to the destination of wafer A, plus the travel time to the source of wafer B and the time to pick up wafer B. Thus for sorting from multiple sources, the limitation is now likely to be the travel time. The sorting time no longer plays any role in the throughput equation. This is advantageous as compared to the robot system with only one assembly or with two end effectors having only one rotting chuck.

In another exemplary embodiment, the present integrated transfer mechanism comprises at least two robot assemblies linked together as a unit. This configuration provides some design and controlling simplicities due to the dependency of the robot assemblies. Throughput can be somewhat reduced since the two robot assemblies move together from one station to another station.

The integrated transfer system thus can comprise a support body having at least two robot assemblies, an additional movement to move the support body, together with a controller for coordinating the robot assemblies. The two robot assemblies each can comprise an x-movement mechanism coupled to the support body for moving an end effector to handle an object in a station. The end effector typically rests within the support body, and extends outward to reach the station. A rotating mechanism corresponding to each end effector is further disposed on the support body for rotating an object when the end effector is at rest position. The additional movement mechanism, such as y-, z, or theta movement mechanism is designed for moving the support body or the two robot assemblies. Thus the two robot assemblies can move together as a unit with the additional movement mechanism, controlled by the controller for coordinating and synchronizing the movements for best efficiency.

Figure 4:
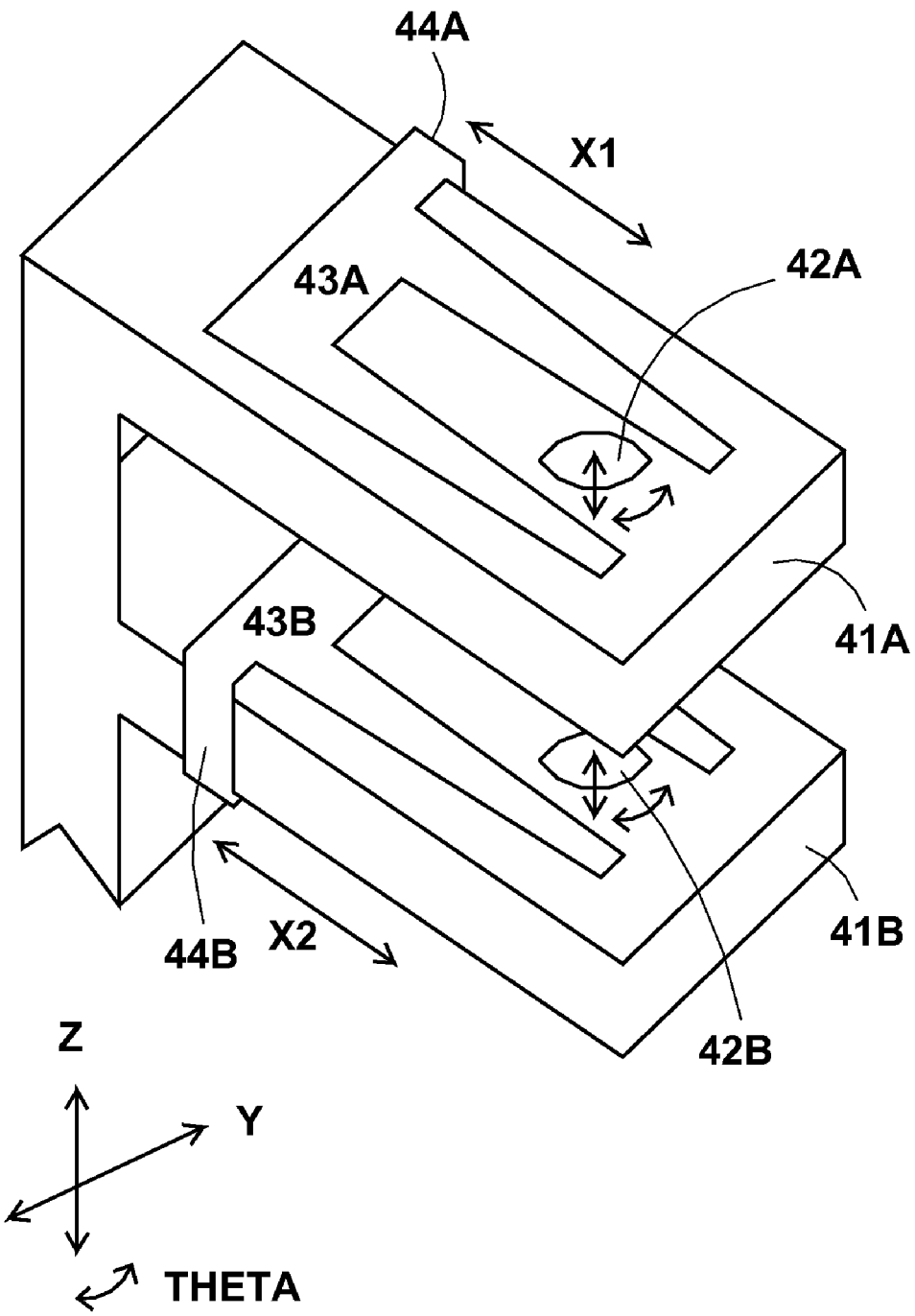
FIG. 4 shows an exemplary integrated transfer mechanism employing two dependent robot assemblies.

FIG. 4 shows an exemplary configuration of two robot assemblies linked together as a unit at the end of the base sections 41A and 41B. Each robot assembly comprises a lift and rotating vacuum chuck, 42A and 42B respectively, together with an end effector, 43A and 43B respectively, traveling in the x direction. Optional OCR camera (not shown) can be disposed on the robot assembly for reading wafer ID. Each vacuum chuck can lift up and rotate to spin the wafer. Each end effector is connected to an x-movement mechanism, 44A and 44B respectively, allowing the end effector to extend and retract to handle a wafer in a storage station. The two x-movement mechanisms are shown to be disposed on opposite sides, with each mechanism attached to the corresponding base section. However, other configurations are possible, for example, both x-movement mechanisms 44a and 44B are disposed on the same side of the base sections 41A and 41B; both x-movement mechanisms 44a and 44B are disposed on a same base section e.g., 41A, on opposite sides or on the same side. If both x-movement mechanisms are disposed on a same base section 41A, the base section 41B can be merged to the robot body for supporting the rotating chuck 42B.

The integrated transfer mechanism comprising two robot assemblies can be connected to additional y-, z- and theta-movement mechanisms, and even to additional x-movement mechanism for moving the whole transfer mechanism, for example, from one station to another station, from a wafer location to another location in the same or different station. The present two robot assemblies can perform simultaneous movements, which are coordinated and synchronized through a controller, not shown.

These configuration sorter and transfer systems employing two robot assemblies can effectively sort wafers in one FOUP and place them in the other FOUP. Since most of the movements are operated in parallel, the throughput of the sorter depends only on the longest operation, and throughput of more than 600 wafers per hour can be achieved. This integrated transfer mechanism can be employed in a transfer system, such as a FIM or FEM, and the arrangement can be employed in a sorter system for wafers or other objects. The FOUPs can be located next to each other in a linear or curvilinear arrangement with varying number of FOUPs. Other wafer containers, such as FOBSs, load lock chambers, or wafer cassettes can also be used.

For independent robot assemblies, the overlapping time between the two robots would be the conflicting time when the two robots cross path, or when the two robots need to access the same general location. For dependent robot assemblies, the movement of the plurality of end effectors is sequentially, meaning one wafer at a time, especially for wafers in different storage containers. There are some cases where two wafers can be accessed at the same time, for example, when the two end effectors receiving (or placing) two wafers in the same FOUP. But in general, wafer accessing is performed sequentially. Thus the integrated transfer mechanism with a plurality of dependent robot assemblies (each with its own alignment/reader subassembly) can provide additional transit time for sorting, alignment, or reading wafer.

In an embodiment, the present integrated transfer system can include seven axis of operation with two robot assemblies. Most actions can occur independently of other axis' operations and can be overlapped to save time. For example, while arm #2 is getting an object #2, arm #1 and centering device #1's operation can be overlapped with arm #2 thereby increasing throughput of the operation. Once arm #2 and centering device #2 become retracted and engaged in centering, the whole robot can move in Z, theta, and translate to the drop off point whereby arm #1 lifts object #1 and places it in its respective final location. During this time, centering device #2 completes its operation and allows arm #2 to grab and ready object #2 for deposition. Thus, object #1 centering and identification is overlapped with object #2's retrieval and the motion of the robot in Z, theta and translation. Likewise object #2's centering and identification is overlapped with the motion of the robot in Z, theta, translation and the placement of object #1. The overlapping of the centering and or object identification times with robotic motion allows for higher system throughputs and reduced costs for the end user.

Figure 5A:
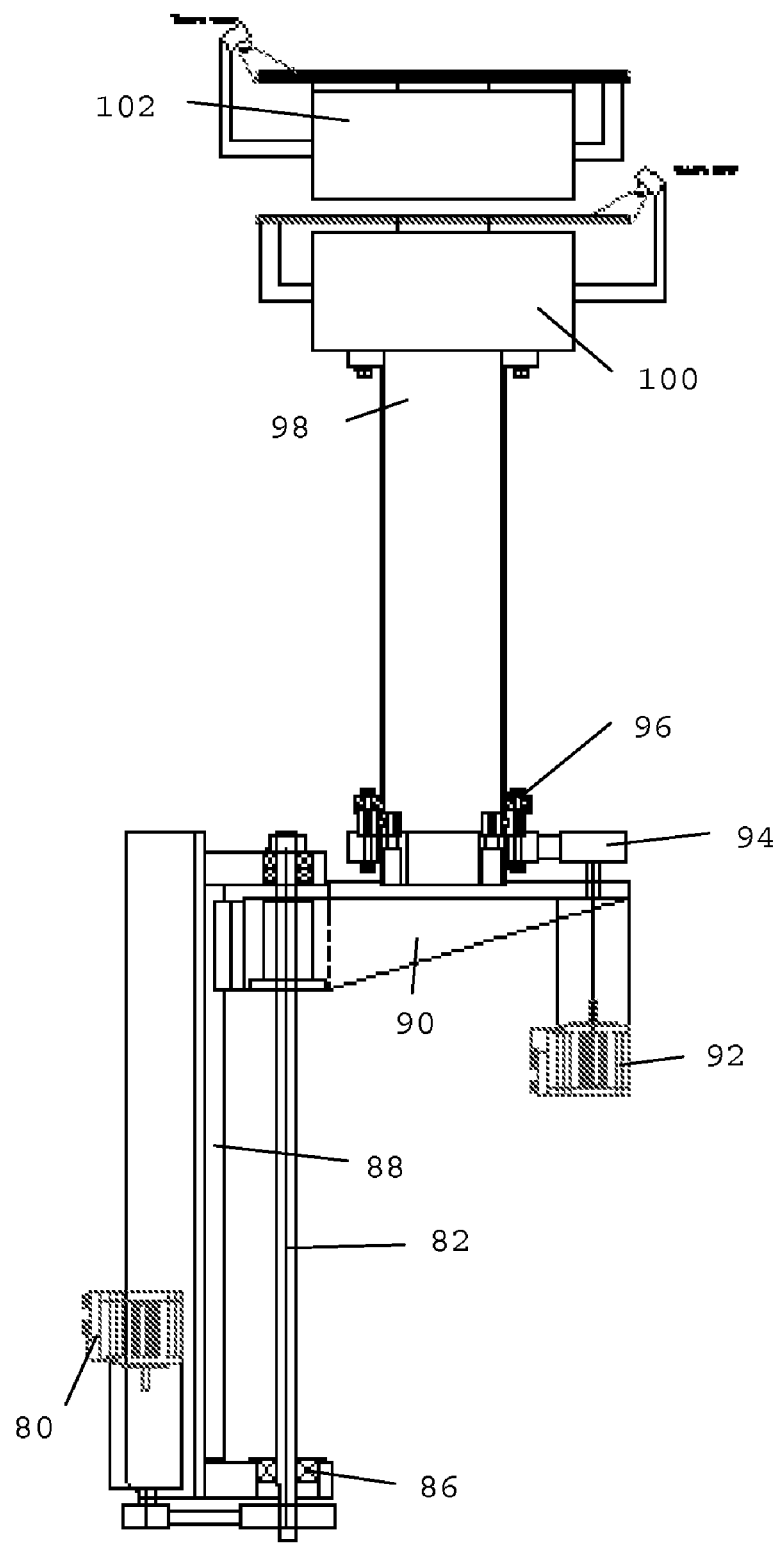
FIG. 5A shows a side view of an exemplary embodiment of the present invention.

FIG. 5A depicts an embodiment of the current invention comprising multiple dependent robot assemblies 100 and 102 mounted on an elevation tube 98 which provides theta axis rotation. A z axis motor 80 provides the z movement for the robot assemblies, by driving a z axis plate 90 through a vertically drive system comprised a vertical lead screw 82, a support bearing 86, and guide rails 88. Mounted to the Z axis plate 90, is the theta drive to provide theta axis rotation. This consists of a positioning motor 92 which positions the theta axis through a drive system 94. The theta axis rotates on the z axis plate via a bearing 96. The theta rotational action is coupled to the upper end effector housing 102 and the lower end effector housing 100 through the elevation tube 98. The whole system is mounted on a translation (y axis) drive (not shown).

Figure 5B:
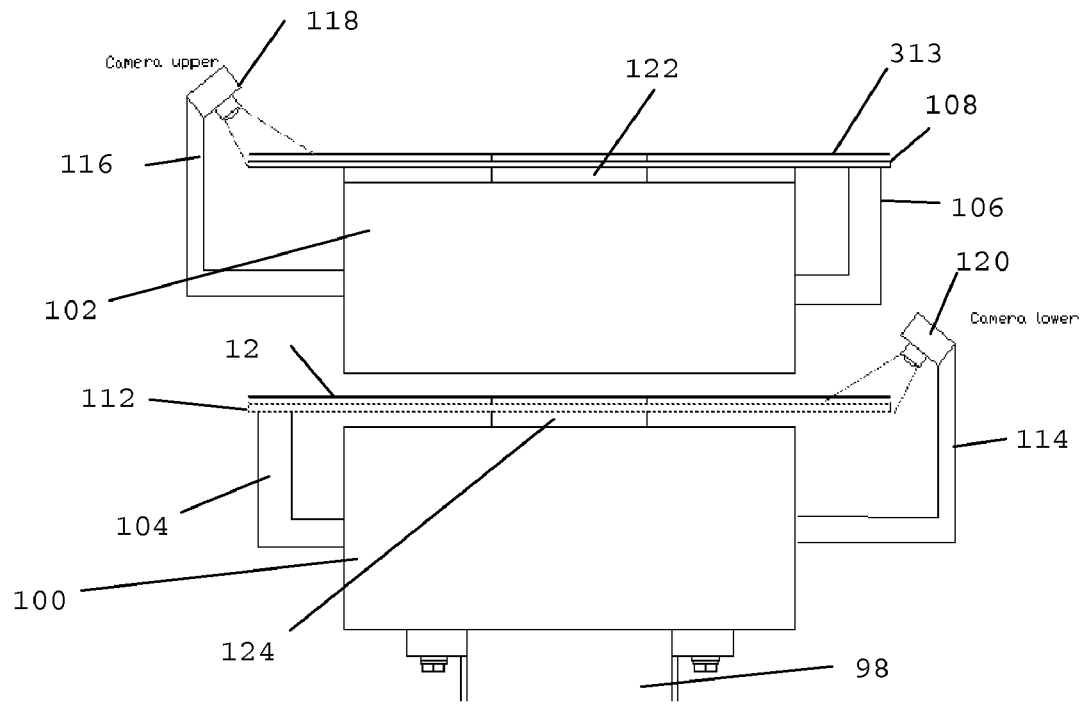
FIG. 5B shows a close up of the present integrated transfer mechanism.

FIG. 5B shows a closer view of the upper end effector housing 102 and the lower end effector housing 100, mounted to the top of the elevation tube 98. The two end effector housings are mechanically coupled to provide a stable structure for robotic operations. As depicted, the lower end effector housing 100 facilitates the lower end effector 112 and its drive mechanism via a mechanical link 104. The lower end effector 112 brings the object 312 from a storage area or FOUP and positions it over a rotatable chuck 124. The rotatable chuck 124 rises to lift the object 312 from the end effector 112 and rotates it for centering calculation and OCR. The lower end effector 112 has an individual camera 120 used for viewing serial number characters. The lower camera 120 is mounted to the lower end effector housing via a bracket 114.

The upper end effector housing 102 supports the upper end effector 108 and its drive mechanism via a mechanical link 106. The upper end effector 108 brings the object 313 from a storage area or FOUP and positions it over a second rotatable chuck 122. The rotatable chuck 122 rises to lift the object 313 from the end effector 108 and rotates it for centering calculation and OCR. The upper end effector 108 has an individual camera 118 used for viewing serial number characters, mounted to the upper end effector housing 102 via a bracket 116. The transfer mechanism depicted in this figure supports two object arms and two rotatable chucks for parallel centering calculations and OCR.

This exemplary configuration connects the multiple robot assemblies first with a theta rotation mechanism, and then the whole system is connected with additional movement mechanism, such as y and z horizontal translation and vertical lift. Other configurations are also possible, such as the multiple robot assemblies can be connected first with a y horizontal translation or a z vertical lift. Further, additional movement mechanisms can be provided, such as 2 horizontal translations.

Figure 6:
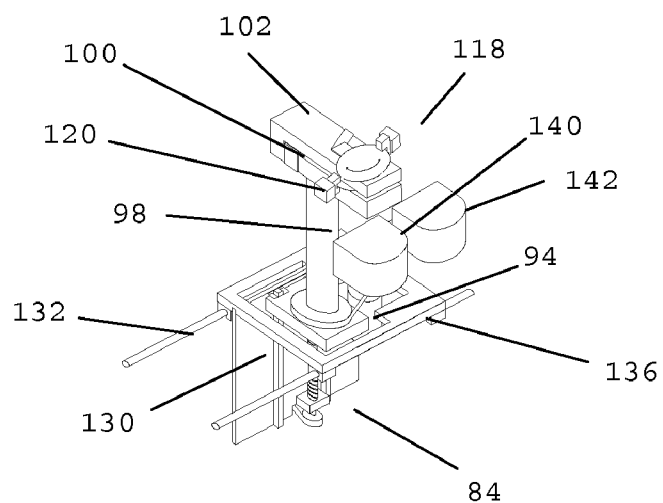
FIG. 6 shows the present integrated transfer mechanism and its relationship to wafer carrying FOUPs.

FIG. 6 depicts the motion axes of the robot. Linear guide rails 132 provide guided motion in the y or translation axis. The translation plate 136 rides on translation bearings through linear guide 132. The z axis plate 130 is attached to the translation plate 136 and provides support for z axis drive 88 including z axis drive belt system and z axis lead screw. The z axis mechanisms position the z axis plate vertically to provide vertical access to object carriers such as FOUPs or cassettes 140 & 142. The theta drive system 94 is mounted to the z axis plate and provides rotational positioning for the elevation tube 98. Atop the elevation tube, the end effector housings 100 and 102 are mounted. Upper OCR camera 118 and lower OCR camera 120 allow serial number identification for the upper end effector and lower end effector respectively.

Figure 7A:
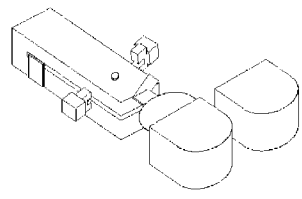
FIGS. 7A-7E shows an exemplary sequence of wafer transfer using the present integrated transfer mechanism.
Figure 7B:
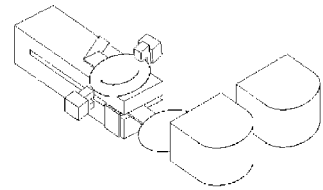
Figure 7C:
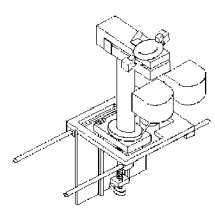
Figure 7D:
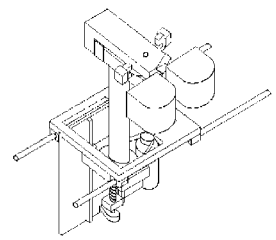
Figure 7E:
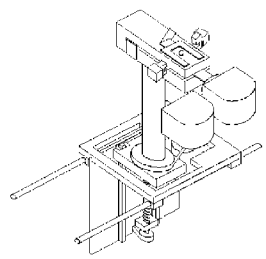

FIGS. 7A-7E depict the present embodiment in operation. FIG. 7A shows a wafer being retrieved by the upper end effector from a FOUP or cassette. FIG. 7B shows the lower end effector retrieves a second wafer from the same FOUP or cassette while the upper end effector has placed the first wafer on a first rotatable chuck and the chuck rotates the wafer for calculating offset or OCR operations. FIG. 7C shows the lower end effector has retracted and the second wafer placed on a second rotatable chuck and the chuck rotates the wafer for calculating offset or OCR operations. The robot translates from a first FOUP to a second FOUP while centering calculations and/or OCR operations are occurring in parallel. FIG. 7D depicts the robot positioned in front of the second FOUP and is depositing the first wafer. During this exchange time, the second wafer is being processed for centering or OCR. FIG. 7E depicts the lower end effector depositing the second wafer into the destination FOUP. Both wafers are processed in parallel to with respect to retrieving and placing operations as well as robot z and translation operations.

Figure 8:
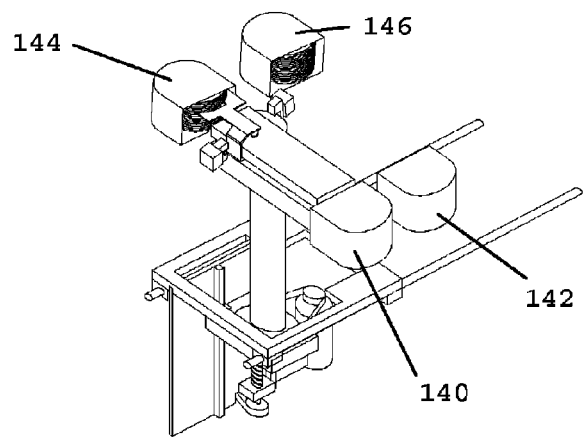
FIG. 8 shows an embodiment of the present integrated transfer mechanism servicing opposable FOUPs.

FIG. 8 depicts a configuration requiring theta operation. The FOUPs 140 and 142 are position linearly in one side, and the FOUPs 144 and 146 are positioned linearly in an opposite side. The rotation theta mechanism of the robot assemblies allows the end effectors to access opposite FOUPs such as 140 and 144.

Figure 9:
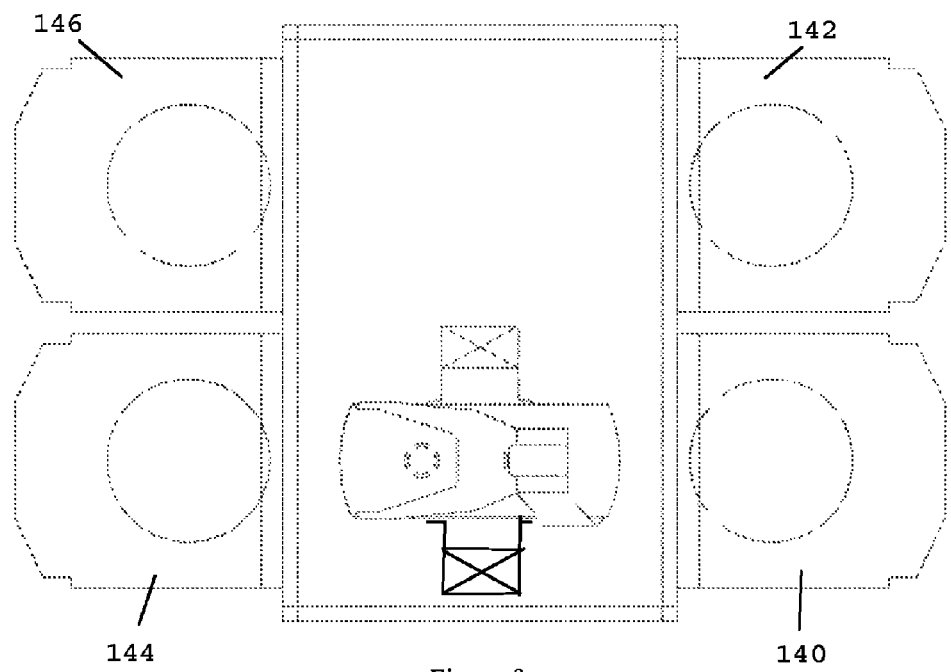
FIG. 9 shows a top view of the present integrated transfer mechanism servicing 2 sets of opposable FOUPs.

FIG. 9 is a top view of the system. The present robot is depicted between two opposing sets of FOUPS or cassettes allowing capability to move laterally between FOUPs/cassettes, to rotate to face an opposing FOUP or cassette, or to move in the z direction to process objects within a given FOUP or cassette.

Figure 10:
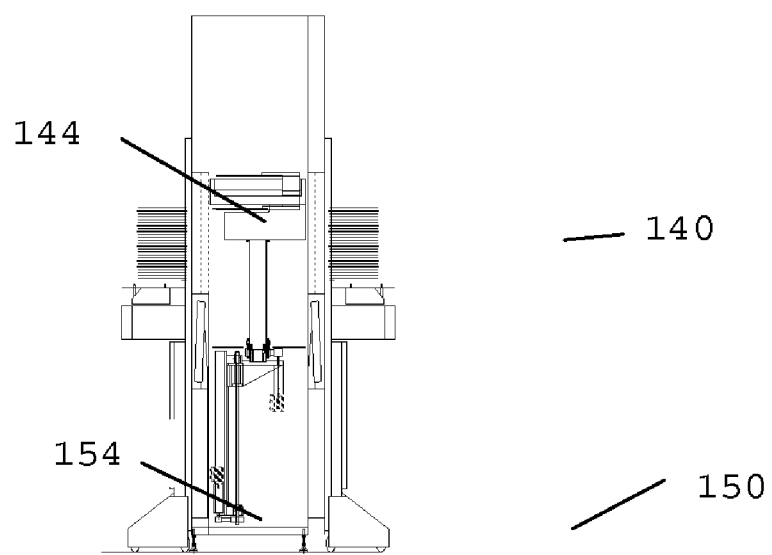
FIG. 10 shows a side view of the present integrated transfer mechanism positioned between opposable FOUPs and FOUP opener's mechanisms.

FIG. 10 shows a side elevation of FOUPs 140 and 144 and their respective opener mechanism 150 and 154, which are surrounded and attached to a system enclosure 158. Within the enclosure the robot can move between FOUP locations through translational y movement mechanism and rotational theta mechanism, and between wafer locations within a FOUP through z movement mechanism. During these motions, wafers are individually processed for centering and OCR, thus maximize throughput of the system.

There has thus been outlined, rather broadly, certain embodiments of the invention in order that the detailed description thereof may be better understood, and in order that the present contribution to the art may be better appreciated. There are, of course, additional embodiments of the invention that will be described below and which will form the subject matter of the claims appended hereto.

The many features and advantages of the invention are apparent from the detailed specification, and thus, it is intended by the appended claims to cover all such features and advantages of the invention, which fall within the true spirit, and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An object transfer system comprising:
   at least two object movement assemblies, each object movement assembly comprising:
      a support body;
      a linear x-movement mechanism coupled to the support body for linearly moving an end effector, wherein the end effector moves between a rest position and an extended position, the extended position reaching into an object station for handling an object in the object station;
      a rotating mechanism coupled to the support body, the rotating mechanism configured to rotate an object relative to the end effector when the end effector is at rest position; and
      an additional movement mechanism for moving the support body; and
   a controller for coordinating the at least two object movement assemblies so that the rotating mechanism rotates an object during the movements of the additional movement mechanisms of the at least two object assemblies, during the movements of the x-movement mechanism of the other object assembly, but not during the movement of the x-movement mechanism of the same object assembly.

2. An object transfer system as in claim 1 wherein the additional movement mechanism is configured to move between a plurality of y-positions for handling an object in different locations in an object station.

3. An object transfer system as in claim 1 wherein the additional movement mechanism is configured to move between a plurality of object stations.

4. An object transfer system as in claim 1 wherein each object movement assembly further comprises a reading mechanism coupled to the support body for reading an ID from an object.

5. An object transfer system as in claim 4 wherein the reading mechanism is configure to identify the object during the movements of the additional movement mechanisms of the at least two object assemblies, during the movements of the x-movement mechanism of the other object assembly, but not during the movement of the x-movement mechanism of the same object assembly.

6. An object transfer system for transferring a plurality of objects between a plurality of object stations, the object transferring assembly comprising:
   a support body;
   at least two object movement assemblies, each object movement assembly comprising:
      a linear x-movement mechanism coupled to the support body for linearly moving an end effector, wherein the end effector moves between a rest position and an extended position, the extended position reaching into an object station for handling an object in the object station; and
      a rotating mechanism coupled to the support body, the rotating mechanism configured to rotate an object relative to the end effector when the end effector is at rest position;
      an additional movement mechanism for moving the support body; and
   a controller for coordinating the at least two object movement assemblies so that the rotating mechanism rotates an object during the movements of the additional movement mechanisms of the at least two object assemblies, during the movements of the x-movement mechanism of the other object assembly, but not during the movement of the x-movement mechanism of the same object assembly.

7. An object transfer system as in claim 6 wherein the additional movement mechanism is configured to move between a plurality of y-positions for handling an object in different locations in an object station.

8. An object transfer system as in claim 6 wherein each object movement assembly further comprises a reading mechanism coupled to the support body for reading an ID from an object.

9. An object transfer system as in claim 8 wherein the reading mechanism is configure to identify the object during the movements of the additional movement mechanisms of the at least two object assemblies, during the movements of the x-movement mechanism of the other object assembly, but not during the movement of the x-movement mechanism of the same object assembly.

10. An object transfer system as in claim 5 wherein the controller is configured to decide the destination of the object by the identification of the object.

11. An object transfer system comprising:
a support body;
at least two object movement assemblies, each object movement assembly comprising:
a linear x-movement mechanism coupled to the support body for linearly moving an end effector, wherein the end effector moves between a rest position and an extended position, the extended position reaching into an object station for handling an object in the object station; and
a rotating mechanism coupled to the support body, the rotating mechanism configured to rotate an object relative to the end effector when the end effector is at rest position;
a theta movement mechanism for rotating the support body between a plurality of object stations;
a linear y-movement mechanism for linearly moving the support body for handling an object in different locations in the object station;
a linear z-movement mechanism for linearly moving the support body between a plurality of object stations; and
a controller for coordinating the at least two object movement assemblies so that the rotating mechanism rotates an object during the movements of the theta, y- and z-movement mechanisms of the at least two object assemblies, during the movements of the x-movement mechanism of the other object assembly, but not during the movement of the x-movement mechanism of the same object assembly.

12. A semiconductor equipment as in claim 11 wherein the rotating mechanism configured to align the object.

13. A semiconductor equipment as in claim 11 wherein each object movement assembly further comprises a reading mechanism coupled to the support body for reading an ID from an object.

14. A semiconductor equipment as in claim 13 wherein the reading mechanism is configure to identify the object during the movements of the y-movement mechanisms of the at least two object assemblies, during the movements of the x-movement mechanism of the other object assembly, but not during the movement of the x-movement mechanism of the same object assembly.

15. A semiconductor equipment as in claim 11 wherein the controller is configured to decide the destination of the object by the identification of the object.

16. A method for simultaneous object transfer for a transfer system, the transfer system comprising at least two linear x-movement mechanisms, each for linearly handling an object in an object location;
at least two rotating mechanisms, each for rotating an object relative to the corresponding x-movement mechanism; and
at least an additional movement mechanism for moving between different object locations;
the method comprising:
rotating an object relative to the corresponding x-movement mechanism during the movements of the additional movement mechanisms, during the movements of the x-movement mechanism of the other object assembly, but not during the movement of the x-movement mechanism of the same object assembly.

17. A method as in claim 16 wherein rotating an object further comprises aligning the object to an alignment mark.

18. A method as in claim 16 wherein rotating an object further comprises identifying the object by reading an ID mark.

19. A method as in claim 16 wherein movements of the additional movement mechanism comprises at least one of movements between object locations of different object stations, and movements between object locations within an object station.

20. A method as in claim 16 wherein rotating an object during movements of the y-movement mechanism between object locations comprises rotating the object while the supports for all objects move to different object locations.

21. A method for simultaneous object transfer for a transfer system, the transfer system comprising
at least two linear x-movement mechanisms, each for linearly handling an object in an object location;
at least two rotating mechanism, each for rotating an object relative to the corresponding x-movement mechanism; and
at least an additional movement mechanism for moving between different object locations;
the method comprising:
while the y-movement mechanism linearly moves to a new object location and while a x-movement mechanism linearly handles an object:
extending a rotating chuck of the rotating mechanism of the other object;
rotating the other object relative to the corresponding x-movement mechanism after extending the rotating chuck; and
retracting the rotating chuck after completing the rotation.

22. A method as in claim 21 wherein rotating an object further comprises aligning the object to an alignment mark.

23. A method as in claim 21 wherein rotating an object further comprises identifying the object by reading an ID mark.

24. A method as in claim 21 wherein additional movements to an object location comprises at least one of
movements between object locations of different object stations, and
movements between object locations within an object station.

25. A method as in claim 21 wherein there are at least two additional movement mechanisms for movements between object locations within an object station and for movements between object stations.

* * * * *